(12) United States Patent
Han et al.

(10) Patent No.: US 10,141,070 B2
(45) Date of Patent: Nov. 27, 2018

(54) SEMICONDUCTOR DEVICE

(71) Applicant: SK hynix Inc., Icheon-si, Gyeonggi-do (KR)

(72) Inventors: Jong Seok Han, Seoul (KR); Byeong Cheol Lee, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/670,759

(22) Filed: Aug. 7, 2017

(65) Prior Publication Data

US 2018/0040383 A1 Feb. 8, 2018

(30) Foreign Application Priority Data

Aug. 8, 2016 (KR) .................. 10-2016-0100771

(51) Int. Cl.
| | | |
|---|---|---|
| *G11C 29/00* | (2006.01) | |
| *G11C 29/02* | (2006.01) | |
| *G11C 29/12* | (2006.01) | |
| *G11C 7/06* | (2006.01) | |
| *G11C 11/4091* | (2006.01) | |

(52) U.S. Cl.
CPC .......... *G11C 29/026* (2013.01); *G11C 29/021* (2013.01); *G11C 29/022* (2013.01); *G11C 29/025* (2013.01); *G11C 29/12005* (2013.01); *G11C 7/065* (2013.01); *G11C 11/4091* (2013.01); *G11C 2029/1204* (2013.01)

(58) Field of Classification Search
CPC .... G11C 29/026; G11C 29/021; G11C 29/022
USPC ....................... 365/201, 205, 207
See application file for complete search history.

(56) References Cited

U.S. PATENT DOCUMENTS

| | | | |
|---|---|---|---|
| 6,081,459 A | 6/2000 | Kim | |
| 7,145,821 B2* | 12/2006 | Kang | .................. G11C 11/4091 365/203 |
| 9,117,545 B1 | 8/2015 | Kim | |
| 2009/0147604 A1* | 6/2009 | Kang | ....................... G11C 7/08 365/205 |
| 2011/0141830 A1* | 6/2011 | Chi | ........................ G11C 7/065 365/189.11 |
| 2016/0284391 A1* | 9/2016 | Song | ................... G11C 11/4091 |

* cited by examiner

*Primary Examiner* — Vu Le
(74) *Attorney, Agent, or Firm* — William Park & Associates Ltd.

(57) ABSTRACT

A semiconductor device may be provided. The semiconductor device may include sense-amplifier test device. The sense-amplifier test device may include a drive signal generator configured to generate a test voltage applying signal for supplying a ground voltage to a pull-up power-supply line of a sense-amplifier. The sense-amplifier test device may include a sense-amplifier driver configured to supply a ground voltage to the pull-up power-supply line of the sense-amplifier, based on the test voltage applying signal.

20 Claims, 6 Drawing Sheets

SEMICONDUCTOR DEVICE

CROSS-REFERENCE TO RELATED APPLICATION

This application claims priority based upon Korean patent application No. 10-2016-0100771, filed on Aug. 8, 2016, the disclosure of which is hereby incorporated in its entirety by reference herein.

BACKGROUND

1. Technical Field

Embodiments of the present disclosure may generally relate to a semiconductor device, and more particularly to a semiconductor device including a sense-amplifier test device.

2. Related Art

A burn-in test is a test method for applying severe conditions (for example, a high temperature and a high pressure) to a semiconductor device for a long period of time. Through using the burn-in test, the reliability of a semiconductor device is guaranteed.

In recent times, as the demand of lower-power semiconductor devices is rapidly increasing, there is a limitation in the voltage levels that are capable of being applied to the semiconductor devices.

Therefore, as the voltage levels applied to the semiconductor device during the burn-in test are gradually reduced, the time consumed to perform the burn-in test is, in effect, rapidly increasing.

SUMMARY

In accordance with an embodiment of the present disclosure, a sense-amplifier test device may be provided. The sense-amplifier test device may include a drive signal generator configured to generate a test voltage applying signal for supplying a ground voltage to a pull-up power-supply line of a sense-amplifier driver. The sense-amplifier driver may be configured to supply the ground voltage to the pull-up power-supply line based on the test voltage applying signal.

In accordance with an embodiment of the present disclosure, a semiconductor device may be provided. The semiconductor device may include a drive signal generator configured to generate a test voltage applying signal for supplying a ground voltage to a pull-up power-supply line of a sense-amplifier. The semiconductor device may include sense-amplifier driver configured to supply a ground voltage to the pull-up power-supply line of the sense amplifier, based on the test voltage applying signal.

In accordance with an embodiment of the present disclosure, a semiconductor device may be provided. The semiconductor device may include a memory cell configured for reading or writing data therein. The semiconductor device may include a sense-amplifier configured to sense and amplify the data according to a voltage applied to a pull-up power-supply line and a pull-down power-supply line. The semiconductor device may include a sense-amplifier test device configured to supply a ground voltage to a pull-up power-supply line of the sense-amplifier.

In accordance with an embodiment of the present disclosure, a semiconductor device may be provided. The semiconductor device may include a first mat and a second mat, each of which may include a plurality of memory cells. The memory cells may be configured for reading or writing data therein. The semiconductor device may include a plurality of sense-amplifiers respectively coupled to the memory cells of the first mat and the second mat, and may be configured to sense and amplify the data according to a voltage applied to a pull-up power-supply line and a pull-down power-supply line. The semiconductor device may include a sense-amplifier test device configured to supply a ground voltage to a pull-up power-supply line of at least one sense-amplifier from among the plurality of sense-amplifiers.

DETAILED DESCRIPTION

Reference will now be made to the embodiments of the present disclosure, examples of which are illustrated in the accompanying drawings. Wherever possible, the same reference numbers will be used throughout the drawings to refer to the same or like parts.

Various embodiments of the present disclosure may be directed to providing a sense-amplifier test device and a semiconductor device including the same that substantially obviate one or more problems due to limitations and disadvantages of the related art.

An embodiment of the present disclosure may relate to a technology for testing a test time without applying a high voltage to a semiconductor device during the burn-in test of the semiconductor device.

Various embodiments of the present disclosure may be directed to a technology for possibly reducing a test time of a sense-amplifier during a burn-in test.

Figure 1:
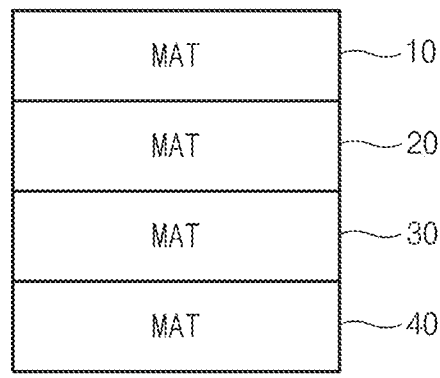
FIG. 1 is a block diagram illustrating a representation of an example of a semiconductor device according to an embodiment of the present disclosure.

FIG. 1 is a view illustrating a memory cell contained in a semiconductor device according to an embodiment of the present disclosure.

Referring to FIG. 1, the memory cell may be classified into a plurality of mats MATs 10~40. The mat MAT may refer to a group of a predetermined number of word lines. The number of word lines contained in one mat may be set to a random number.

A burn-in test for use in the semiconductor device according to an embodiment may be carried out by sequentially activating the respective mats.

For example, according to an embodiment, the mat 10 is first activated, and the remaining mats 20~40 are not deactivated. Therefore, an active precharge command is sequentially applied to word lines contained in the mat 10. A severe condition, i.e., a high-temperature and/or high-voltage condition, may be applied to word lines contained in the mats 20~40.

Subsequently, mat 20 is first activated and the remaining mats 10, 30, and 40 are deactivated, such that the active-precharge command is applied to word lines contained in the mat 20 while a severe condition is applied to other word lines contained in the mats 10, 30, and 40.

Thereafter, the mats 30 and 40 are sequentially activated such that the burn-in test for the mats 30 and 40 is carried out in a similar way to the other mats 10 and 20.

In other words, the burn-in test for the semiconductor device according to the present disclosure is carried out by testing whether word lines (i.e., cells) contained in a certain mat are normally operated under the condition that a severe condition is applied to other mats.

Figure 2:
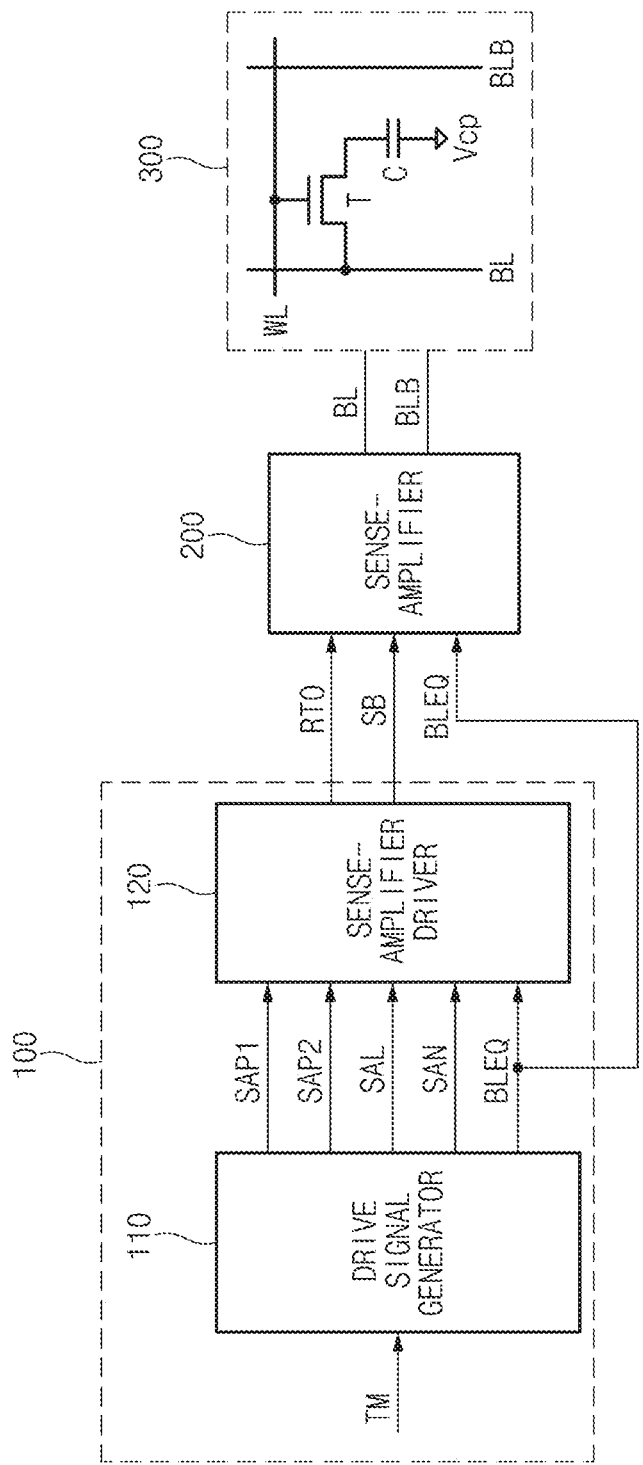
FIG. 2 is a view illustrating a representation of an example of a semiconductor device according to an embodiment of the present disclosure.

FIG. 2 is a block diagram illustrating a representation of an example of a semiconductor device according to an embodiment of the present disclosure.

Referring to FIG. 2, the semiconductor device according to an embodiment may include a sense-amplifier test device 100, a sense-amplifier 200, and a memory cell 300. In this case, the sense-amplifier test device 100 may include a drive signal generator 110 and a sense-amplifier driver 120.

The drive signal generator 110 may generate a plurality of pull-up drive signals SAP1, SAP2, and SAL, a pull-down drive signal SAN, and a precharge signal BLEQ according to a test mode signal TM. The pull-down drive signal SAN and the plurality of pull-up drive signals SAP1, SAP2, and SAL may be respectively activated for reserved periods. The test mode signal TM may be received from the external part to perform the burn-in test of the semiconductor device, and may be comprised of one or more bits. In an embodiment, for example, the pull-up drive signal SAL may be a test voltage applying signal.

The sense-amplifier driver 120 may provide a power-supply voltage to a pull-up power-supply line RTO and a pull-down power-supply line SB according to the pull-up drive signals SAP1, SAP2, and SAL and the pull-down drive signal SAN.

The sense-amplifier driver 120 may drive the pull-up power-supply line RTO by a power-supply voltage VDD (first pull-up voltage), a core voltage VCORE (second pull-up voltage), or a ground voltage (VSS) level in response to the pull-up drive signal SAP1, SAP2, or SAL.

The sense-amplifier driver 120 may drive the pull-down power-supply line SB with the ground voltage (VSS) level in response to the pull-down drive signal SAN.

The sense-amplifier driver 120 may precharge the pull-up power-supply line RTO and the pull-down power-supply line SB with an precharge voltage (VBLP) level in response to the precharge signal BLEQ.

The sense-amplifier 200 may operate by a driving power source applied to the pull-up power-supply line RTO and the pull-down power-supply line SB. The sense-amplifier 200 may sense and amplify data received from the memory 300 through the pair of bit lines BL and BLB, and may output the amplified data to the sensing line.

The sense-amplifier 200 may precharge the pair of bit lines BL and BLB with the precharge voltage (VBLP) level in response to the precharge signal BLEQ.

During activation of the word line WL, the memory cell 300 may store data received from the pair of bit lines BL and BLB, or may output the stored data to the sense-amplifier 200 through the pair of bit lines BL and BLB.

A unit cell of the memory cell 300 may include a single switching element T and a single capacitor C. In this case, the switching element T may be coupled between the bit line BL and the capacitor C, and may thus be selectively switched according to the word line WL. The capacitor C may be coupled between a cell plate voltage terminal Vcp and the switching element T, and may store data therein. During activation of the word line WL, the switching element T is turned on such that data received from the bit line BL is stored in the capacitor C.

An aforementioned sense-amplifier test device 100 may output a high voltage to the sense-amplifier 200 coupled to a non-active mat by controlling the pull-up power-supply line RTO, the pull-down power-supply line SB, and the precharge signal BLEQ. The sense-amplifier test device 100 may perform a general active-precharge operation by controlling the pull-up power-supply line RTO, the pull-down power-supply line SB, and the precharge signal BLEQ for the sense-amplifier 200 coupled to the active mat.

Figure 4:
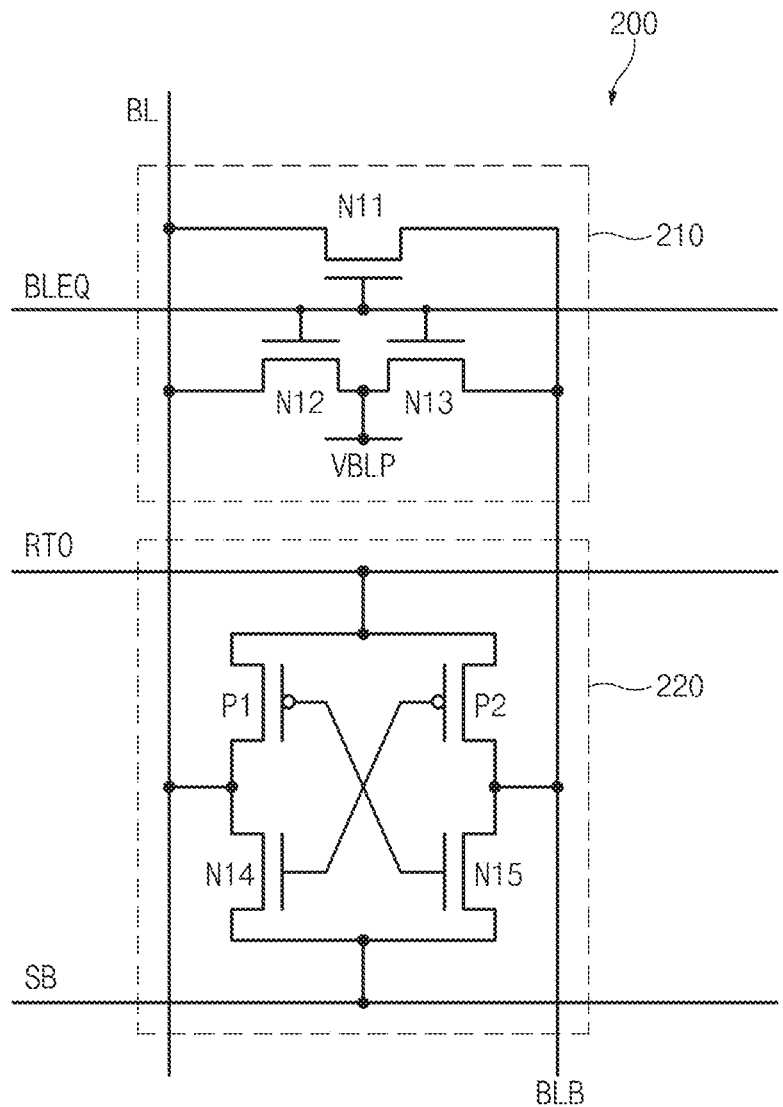
FIG. 4 is a circuit diagram illustrating a representation of an example of a sense-amplifier illustrated in FIG. 2.

For example, the sense-amplifier test device 100 may provide the ground voltage VSS to the pull-up power-supply line RTO coupled to the sense-amplifier 200 coupled to the cell 300 contained in the non-active mat, and may provide the ground voltage VSS to the pull-down power-supply line SB. According to the above-mentioned constituent elements, in association with PMOS transistors P1 and P2 contained in the sense-amplifier 200 as illustrated in FIG. 4, a gate voltage, a source voltage, and a drain voltage (i.e., gate-source-drain voltage) of each PMOS transistor P1 or P2 may be at a ground voltage VSS. In this case, a power-supply voltage VPP may be applied as a bulk bias voltage. Therefore, in association with the PMOS transistors P1 and P2, a difference between the gate-source-drain voltage VSS and the bulk bias voltage VPP is denoted by VPP-VSS, and stress corresponding to VPP-VSS may be applied to the PMOS transistors P1 and P2.

As a comparison example, it is assumed that the core voltage VCORE is supplied to the pull-up power-supply line RTO. The power-supply voltage VPP may be applied as a bulk bias voltage. In this case, in association with the PMOS transistors P1 and P2 contained in the sense-amplifier 200 illustrated in FIG. 4, a gate voltage, a source voltage, and a drain voltage (i.e., gate-source-drain voltage) of each PMOS transistor P1 or P2 may be at the core voltage VCORE. Therefore, in association with the PMOS transistors P1 and P2, a difference between the gate-source-drain voltage VCORE and the bulk bias voltage VPP is denoted by VCORE-VSS.

For example, the core voltage VCORE is a voltage internally generated by division of the power-supply voltage or the like. The core voltage VCORE may be less than the power-supply voltage VPP. For example, the core voltage VCORE may be a ½ level of the power-supply voltage VPP. Therefore, although stress corresponding to VPP-VSS is applied to the PMOS transistors P1 and P2 according to an embodiment, stress corresponding to VCORE-VSS may be applied to the PMOS transistors P1 and P2 according to the comparison example. That is, according to an embodiment, the ground voltage VSS is applied to the pull-up power-supply line RTO, higher stress is applied to the sense-amplifier 200, resulting in reduction of a test time.

The sense-amplifier test device 100 provides the ground voltage VSS to the sense-amplifier 200 coupled to the memory cell of the active mat through the pull-down power-supply line SB, and at the same time sequentially provides the power-supply voltage VDD and the core voltage VCORE to the sense-amplifier 200 through the pull-up power-supply line RTO, such that the sense-amplifier test device 100 may perform an active command. Thereafter, the sense-amplifier test device 100 may activate the precharge signal BLEQ, may provide the precharge voltage VBLP to the pair of bit lines BL and BLB, and may thus perform a precharge command.

Therefore, the sense-amplifier test device 100 may recognize whether the memory cell 300 contained in the active mat has normally operated under the condition that a severe condition has been applied to the active mat. For example, the above active-precharge command is carried out as a row operation for the memory cell 300 contained in the active mat, and at the same time a write command and a read command are carried out as a column operation for the memory cell 300, such that the sense-amplifier test device 100 may recognize whether the write operation for the memory cell 300 contained in the active mat has normally operated.

The above-mentioned method for recognizing whether the active mat has normally operated is disclosed only for illustrative purposes, and various well-known methods can also be used without departing from the scope or spirit of the present disclosure.

Figure 3:
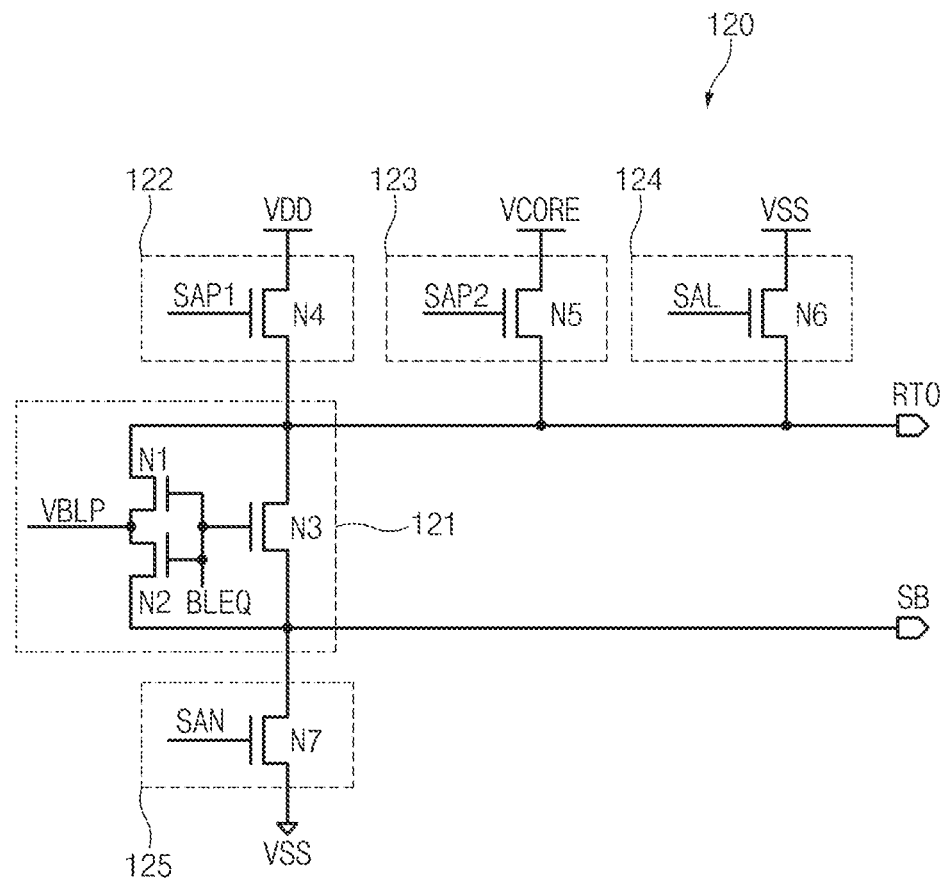
FIG. 3 is a circuit diagram illustrating a representation of an example of a sense-amplifier driver illustrated in FIG. 2.

FIG. 3 is a circuit diagram illustrating the sense-amplifier driver 120 illustrated in FIG. 2.

Referring to FIG. 3, the sense-amplifier driver 120 may include a precharge driver 121, pull-up drivers 122 and 123, a test voltage applying circuit 124, and a pull-down driver 125.

The precharge driver 121 may provide the precharge voltage VBLP to the pull-up power-supply line RTO and the pull-down power-supply line SB according to the precharge signal BLEQ during precharging of the word line contained in the active mat. The precharge driver 121 may include a plurality of NMOS transistors N1~N3 in which gate terminals are commonly coupled.

The NMOS transistor N1 may be coupled to the precharge voltage (VBLP) input terminal and the pull-up power-supply line RTO, and the NMOS transistor N2 may be coupled between the precharge voltage (VBLP) input terminal and the pull-down power-supply line SB. The NMOS transistor N3 may be coupled between the pull-up power-supply line RTO and the pull-down power-supply line SB.

If the pull-up drive signal SAP1 is activated during activation of the word line contained in the active mat, the pull-up driver 122 may provide the power-supply voltage VDD to the pull-up power-supply line RTO. The pull-up driver 122 may include an NMOS transistor N4. The NMOS transistor N4 may be coupled between the power-supply voltage (VDD) input terminal and the pull-up power-supply line RTO, and may receive the pull-up drive signal SAP1 through a gate terminal thereof.

If the pull-up drive signal SAP2 is activated for the word line contained in the active mat, the pull-up driver 123 may provide the core voltage VCORE to the pull-up power-supply line RTO. The pull-up driver 123 may include an NMOS transistor N5. The NMOS transistor N5 may be coupled between the core voltage (VCORE) input terminal and the pull-up power-supply line RTO, and may receive the pull-up drive signal SAP2 through a gate terminal thereof.

If the drive signal SAL is activated for the word line contained in the non-active mat, the test voltage applying circuit 124 may provide the ground voltage VSS to the pull-up power-supply line RTO. The pull-up driver 124 may include an NMOS transistor N6. The NMOS transistor N6 may be coupled between the ground voltage (VSS) input terminal and the pull-up power-supply line RTO, and may receive the drive signal SAL through a gate terminal thereof.

If the pull-down drive signal SAN is activated for the word lines contained in the active mat and the non-active mat, the pull-down driver 125 may provide the ground voltage VSS to the pull-down power-supply line SB. The pull-down driver 125 may include an NMOS transistor N7. The NMOS transistor N7 may be coupled between the ground voltage (VSS) input terminal and the pull-down power-supply line SB, and may receive the pull-down drive signal SAN through a gate terminal thereof.

FIG. 4 is a circuit diagram illustrating the sense-amplifier 200 of FIG. 2.

Referring to FIG. 4, the sense-amplifier 200 may include a precharge circuit 210 and a sensing circuit 220. For example, the precharge circuit 210 may include a plurality of NMOS transistors N11~N13 in which gate terminals are commonly coupled. The NMOS transistor N11 may be coupled between the bit lines BL and BLB. The NMOS transistors N12 and N13 may be coupled in series between the bit lines BL and BLB, and may receive the precharge voltage VBLP through a common drain terminal. The plurality of NMOS transistors N11~N13 may receive the precharge signal BLEQ through a common gate terminal.

In the precharge circuit 210, if the precharge signal BLEQ is at a high level, all the NMOS transistors N11~N13 are turned on such that the pair of bit lines BL and BLB may be precharged with the precharge voltage (VBLP) level. If the precharge signal BLEQ is at a low level, all the NMOS transistors N11~N13 are turned off.

Therefore, the precharge operation for the sense-amplifier 200 coupled to the active mat is carried out.

The sensing circuit 220 may include PMOS transistors P1 and P2 and NMOS transistors N14 and N15 configured in the form of a latch structure. Gate terminals of the PMOS transistors P1 and P2 and the NMOS transistors N14 and N15 are cross-coupled to one another.

In this case, the PMOS transistor P1 and the NMOS transistor N14 may be coupled in series between the pull-up power-supply line RTO and the pull-down power-supply line SB. A common drain terminal of the PMOS transistor P1 and the NMOS transistor N14 may be coupled to the bit line BL. The PMOS transistor P2 and the NMOS transistor N15 may be coupled in series between the pull-up power-supply line RTO and the pull-down power-supply line SB. A common drain terminal of the PMOS transistor P2 and the NMOS transistor N15 may be coupled to the bit line BLB.

By the above-mentioned structure, in the case of the active mat, the sensing circuit 220 may store data of the pair of bit lines BL and BLB in the PMOS transistors P1 and P2 and the NMOS transistors N14 and N15 configured in the form of a latch structure according to the drive signal received from the pull-up power-supply line RTO and the pull-down power-supply line SB. For example, when the ground voltage VSS is applied to the pull-down power-supply line SB, the power-supply voltage VDD and the core voltage VCORE are sequentially applied to the pull-up power-supply line RTO, such that the active command for the active mat may be carried out.

In the case of the non-active mat, the ground voltage VSS may be applied to the pull-up power-supply line RTO of the sensing circuit 220, and the ground voltage VSS may also be applied to the pull-down power-supply line SB of the sensing circuit 220. Therefore, a gate voltage, a source voltage, and a drain voltage (i.e., gate-source-drain voltage) of the PMOS transistors P1 and P2 may be at a ground voltage VSS. In this case, the power-supply voltage VPP may be applied as a bulk bias voltage of the PMOS transistors P1 and P2. Therefore, a difference between the gate-source-drain voltage and the bulk bias voltage of the PMOS transistors P1 and P2 may be denoted by VPP-VSS, such that relatively high stress may be applied to the PMOS transistors P1 and P2.

In this case, the reason why the power-supply voltage VPP is applied as a bulk bias voltage of the PMOS transistors P1 and P2 is to apply a maximum voltage capable of being applied to the semiconductor device 100 to allocate high stress (or strong stress) to the PMOS transistors P1 and P2. However, the above-mentioned description is disclosed only for illustrative purposes, and other voltages having other levels may also be applied as a bulk bias voltage of the PMOS transistors P1 and P2.

By the above-mentioned structure, a high voltage is applied to the sense-amplifier 200 coupled to the active mat to apply high stress to the sense-amplifier 200, and the active-precharge operation for the sense-amplifier 200 coupled to the active mat is carried out, such that the above-mentioned structure can test whether the memory cell 300 contained in the active mat may normally operate in a severe condition.

Figure 5A:
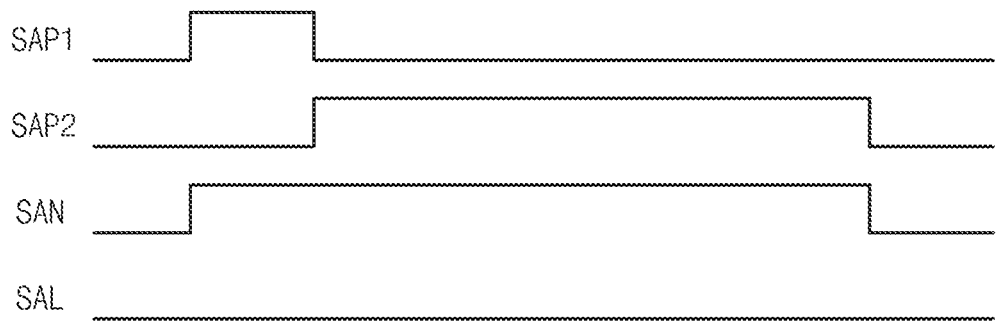
FIGS. 5A and 5B are timing diagrams illustrating a representation of an example of the operations of the sense-amplifier test device illustrated in FIG. 2.
Figure 5B:
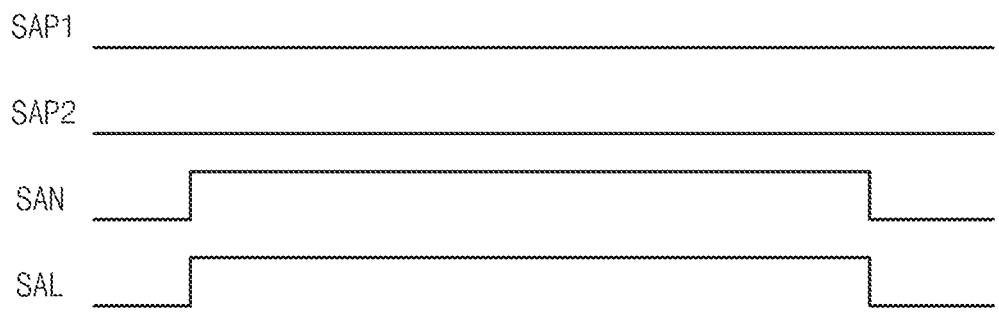

FIGS. 5A and 5B are timing diagrams illustrating the operation of the sense-amplifier test device 100 illustrated in FIG. 2. FIG. 5A illustrates the case of the active mat, and FIG. 5B illustrates the case of the non-active mat.

Referring to FIG. 5A, if the active command is input to a specific word line of the active mat, the pull-up drive signal SAP1 is at a high level and the pull-down drive signal SAN is at a high level during a predetermined time (over-driving period). Therefore, the power-supply voltage VDD is supplied to the pull-up power-supply line RTO, and the ground voltage VSS is supplied to the pull-down power-supply line SB.

Subsequently, the pull-up drive signal SAP2 is at a high level during a predetermined time (active period), such that the core voltage VCORE is supplied to the pull-up power-supply line RTO. As a result, the pull-down drive signal SAN remains high in level, such that the ground voltage VSS is continuously supplied to the pull-down power-supply line SB.

A data level of the pair of bit lines BL and BLB may be amplified by the sensing circuit 220 according to the pull-down drive signal SAN and the pull-up drive signals SAP1 and SAP2.

Thereafter, if the precharge command is input to the sense-amplifier test device 100, the precharge signal BLEQ is activated (not illustrated), such that the precharge voltage VBLP is supplied to the pair of bit lines BL and BLB.

By the operation of the sense-amplifier test device 100, the write command and/or the read command are performed for the word line contained in the active mat, such that the sense-amplifier test device 100 can determine whether the word line of the active mat is normally operating.

The above-mentioned operation may be sequentially performed in the plurality of word lines contained in the active mat. If the active-precharge command operation for a specific active mat is completed, the operation of the active-precharge command may be sequentially performed in word lines contained in the other mat.

Referring to FIG. 5B, when the active command for the active mat illustrated in FIG. 5A is performed, a severe condition is applied to non-active mat(s). For example, the pull-up drive signal SAL for the non-active mat is at a high level and the pull-down drive signal SAN for the non-active mat is at a high level. Therefore, the ground voltage VSS is supplied to the pull-up power-supply line RTO, and the ground voltage VSS is supplied to the pull-down power-supply line SB.

Therefore, the ground voltage VSS is supplied to gate, source, and drain terminals of the PMOS transistors P1 and P2 of the sense-amplifier 200 illustrated in FIG. 4. Therefore, a relatively high voltage may be applied to the PMOS transistors P1 and P2, resulting in reduction of an execution time of the burn-in test.

The above-mentioned description has disclosed an explanation of the embodiments. For reference, the embodiments may include additional structures for better understanding of the embodiments as necessary although the additional structures are not directly associated with technical ideas. In addition, the Active High or Active Low constructions for indicating deactivation states of a signal and circuit may be changed according to the embodiments. In order to implement the same function, a transistor structure may be modified as necessary. That is, the PMOS transistor and the NMOS transistor may be replaced with each other as necessary, and may be implemented using various transistors as necessary. The above-mentioned circuit modification may be very frequently generated, such that a very high number of cases may exist and associated modification can be easily appreciated by those skilled in the art, and as such a description thereof will herein be omitted for convenience of description.

As is apparent from the above description, the sense-amplifier test device and the semiconductor device including the same according to the embodiments of the present disclosure can reduce a test time by applying a high voltage to a sense-amplifier during the burn-in test.

Figure 6:
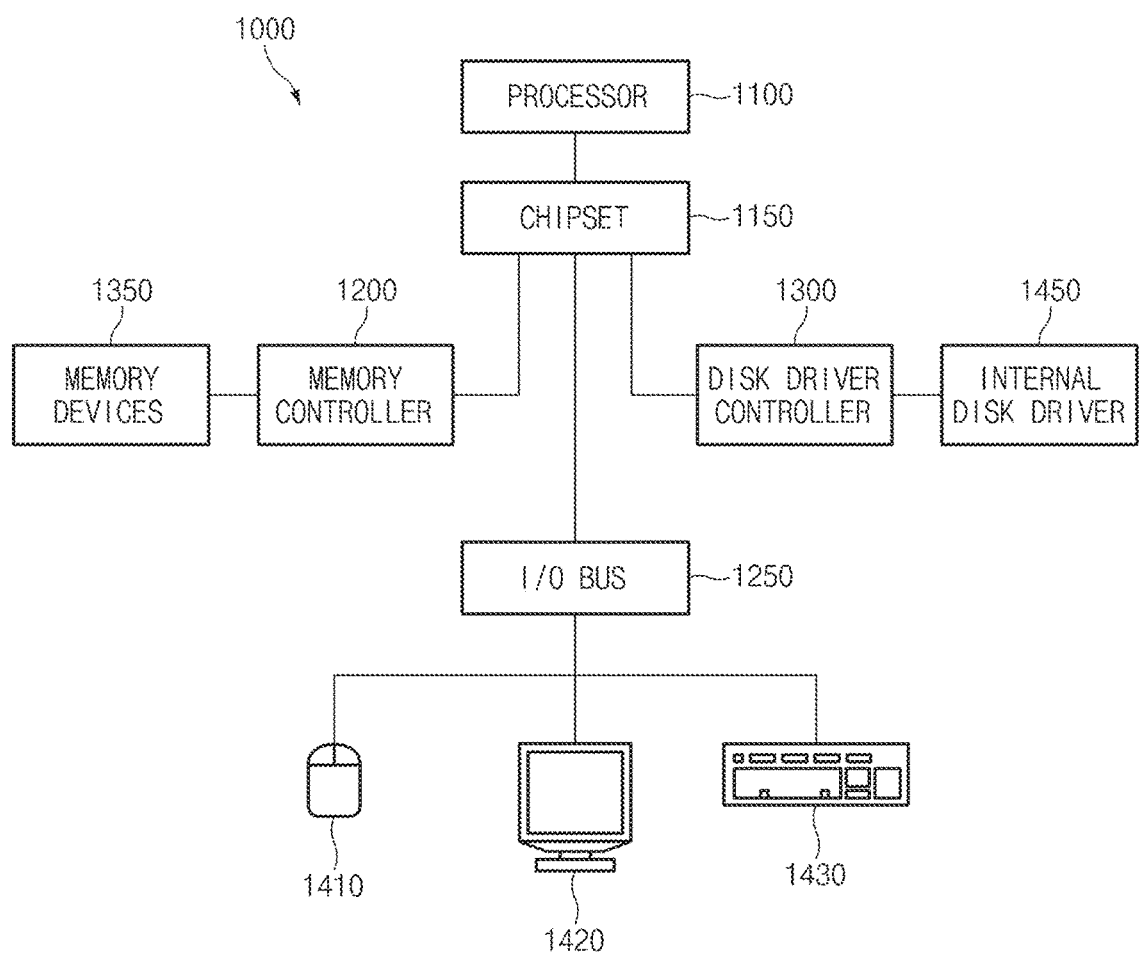
FIG. 6 illustrates a block diagram of an example of a representation of a system employing a semiconductor device and or sense-amplifier test device with the various embodiments discussed above with relation to FIGS. 1-5B.

The semiconductor devices and or sense-amplifier test devices as discussed above (see FIGS. 1-5B) are particular useful in the design of other memory devices, processors, and computer systems. For example, referring to FIG. 6, a block diagram of a system employing a semiconductor device and or sense-amplifier test device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and or sense-amplifier test device as discussed above with reference to FIGS. 1-5B. Thus, the memory controller 1200 can receive a request provided from the processor (i.e., CPU)

1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and or sense-amplifier test device as discussed above with relation to FIGS. 1-5B, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 6 is merely one example of a semiconductor device and or sense-amplifier test device as discussed above with relation to FIGS. 1-5B. In alternate embodiments, such as, for example but not limited to, cellular phones or digital cameras, the components may differ from the embodiments illustrated in FIG. 6.

Those skilled in the art will appreciate that the embodiments may be carried out in other specific ways than those set forth herein without departing from the spirit and essential characteristics. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A sense-amplifier test device comprising:
   a drive signal generator configured to generate a test voltage applying signal for supplying a ground voltage to a pull-up power-supply line of a sense-amplifier driver, based on a test mode signal; and
   wherein the sense-amplifier driver is configured to supply the ground voltage to the pull-up power-supply line, based on the test voltage applying signal.

2. The sense-amplifier test device according to claim 1, wherein the sense-amplifier driver is configured to supply a bulk bias voltage to the pull-up power-supply line.

3. The sense-amplifier test device according to claim 2, wherein the bulk bias voltage is a power-supply voltage.

4. A semiconductor device comprising:
   a drive signal generator configured to generate a test voltage applying signal for supplying a ground voltage to a pull-up power-supply line of a sense-amplifier; and
   a sense-amplifier driver configured to supply the ground voltage to the pull-up power-supply line of the sense amplifier, based on the test voltage applying signal.

5. A semiconductor device comprising:
   a memory cell configured for reading or writing data therein;
   a sense-amplifier configured to sense and amplify the data according to a voltage applied to a pull-up power-supply line and a pull-down power-supply line; and
   a sense-amplifier test device configured to supply a ground voltage to a pull-up power-supply line of the sense-amplifier.

6. The semiconductor device according to claim 5, wherein the sense-amplifier test device includes:
   a drive signal generator configured to generate a test voltage applying signal for supplying the ground voltage to the pull-up power-supply line of the sense-amplifier; and
   a sense-amplifier driver configured to supply the ground voltage to the pull-up power-supply line of the sense-amplifier, based on the test voltage applying signal.

7. The semiconductor device according to claim 5, wherein the sense-amplifier driver is configured to supply a bulk bias voltage to the sense-amplifier.

8. The semiconductor device according to claim 7, wherein the bulk bias voltage is a power-supply voltage.

9. A semiconductor device comprising:
   a first mat and a second mat, each of which includes a plurality of memory cells, the memory cells configured for reading or writing data therein;
   a plurality of sense-amplifiers respectively coupled to the memory cells of the first mat and the second mat, and configured to sense and amplify the data according to a voltage applied to a pull-up power-supply line and a pull-down power-supply line; and
   a sense-amplifier test device configured to supply a ground voltage to a pull-up power-supply line of at least one sense-amplifier from among the plurality of sense-amplifiers.

10. The semiconductor device according to claim 9, wherein the sense-amplifier test device includes:
   a drive signal generator configured to generate a test voltage applying signal for supplying the ground voltage to the pull-up power-supply line of the at least one sense-amplifier; and a sense-amplifier driver configured to supply the ground voltage to the pull-up power-supply line of the at least one sense-amplifier, based on the test voltage applying signal.

11. The semiconductor device according to claim 9, wherein the sense-amplifier driver is configured to supply a power-supply voltage as a bulk bias voltage to the sense-amplifier.

12. The semiconductor device according to claim 9, wherein:
the at least one sense-amplifier is coupled to memory cells of the first mat; and
the sense-amplifier test device is configured to supply a ground voltage to the pull-up power-supply line of the plurality of sense-amplifiers respectively coupled to the plurality of memory cells of the first mat.

13. The semiconductor device according to claim 10, wherein:
the at least one sense-amplifier is coupled to memory cells of the first mat;
the drive signal generator is configured to generate a pull-up drive signal and a pull-down drive signal to drive the sense-amplifier coupled to memory cells of the second mat; and
the sense-amplifier driver is configured to test the memory cells of the second mat by driving the sense-amplifier coupled to the memory cells of the second mat in response to the pull-up drive signal and the pull-down drive signal.

14. The semiconductor device according to claim 13, wherein:
the drive signal generator is configured to sequentially activate a first pull-up drive signal and a second pull-up drive signal as the pull-up drive signals; and
the sense-amplifier driver supplies a power-supply voltage to a pull-up power-supply line of the sense-amplifier coupled to memory cells of the second mat based on the first pull-up drive signal, and supplies a core voltage to the pull-up power-supply line of the sense-amplifier coupled to memory cells of the second mat based on the second pull-up drive signal.

15. The semiconductor device according to claim 14, wherein the core voltage is a ½ level of the power-supply voltage.

16. The semiconductor system according to claim 13, wherein:
the drive signal generator generates the pull-up drive signal and the pull-down drive signal for sequentially driving the respective sense-amplifiers coupled to the plurality of memory cells of the second mat; and
the sense-amplifier driver sequentially tests whether the plurality of memory cells of the second mat are operating normally by sequentially driving the sense-amplifier coupled to the plurality of memory cells of the second mat in response to the pull-up drive signal and the pull-down drive signal.

17. The semiconductor system according to claim 13, wherein:
the drive signal generator, upon completion of the test of the memory cells of the second mat, generates a test voltage applying signal for supplying a ground voltage to a pull-up power-supply line of a sense-amplifier coupled to any one of the plurality of memory cells of the second mat; and
the sense-amplifier driver supplies the ground voltage to a pull-up power-supply line of a sense-amplifier coupled to any one of the plurality of memory cells of the second mat, based on the test voltage applying signal.

18. The semiconductor system according to claim 17, wherein:
the drive signal generator generates a pull-up drive signal and a pull-down drive signal for driving the sense-amplifier coupled to memory cells of the first mat; and
the sense-amplifier driver tests the memory cells of the first may by driving the sense-amplifier coupled to memory cells of the first mat in response to the pull-up drive signal and the pull-down drive signal.

19. The semiconductor system according to claim 18, wherein:
the drive signal generator generates a pull-up drive signal and a pull-down drive signal for sequentially driving the plurality of sense-amplifiers coupled to the plurality of memory cells of the first mat; and
the sense-amplifier driver sequentially tests whether the plurality of memory cells of the first mat are operating normally by sequentially driving the sense-amplifiers coupled to the plurality of memory cells of the first mat in response to the pull-up drive signal and the pull-down drive signal.

20. The semiconductor system according to claim 9, wherein the sense-amplifier test device is configured to supply a ground voltage to a pull-up power-supply line of a sense-amplifier coupled to a deactivated mat from among the first mat and the second mat.

* * * * *